United States Patent
Hong et al.

(10) Patent No.: US 9,690,200 B2
(45) Date of Patent: Jun. 27, 2017

(54) OPTICAL APPARATUS AND MANUFACTURING METHOD USING THE SAME

(71) Applicant: Samsung Electronics Co., Ltd., Suwon-si (KR)

(72) Inventors: Sangjoon Hong, Seoul (KR); Jongjin Lee, Seoul (KR); Hikuk Lee, Yongin-si (KR); Sangdon Jang, Suwon-si (KR); Inbae Chang, Seoul (KR)

(73) Assignees: SAMSUNG ELECTRONICS CO., LTD., Samsung-ro, Yeongtong-gu, Suwon-si, Gyeonggi-do (KR); SAMSUNG DISPLAY CO., LTD., Giheung-gu, Yongin, Gyeonggi-do (KR)

( * ) Notice: Subject to any disclaimer, the term of this patent is extended or adjusted under 35 U.S.C. 154(b) by 37 days.

(21) Appl. No.: 14/867,292

(22) Filed: Sep. 28, 2015

(65) Prior Publication Data

US 2016/0097981 A1    Apr. 7, 2016

(30) Foreign Application Priority Data

Oct. 7, 2014    (KR) .................. 10-2014-0135067

(51) Int. Cl.
  *G03B 27/54* (2006.01)
  *G03F 7/16* (2006.01)
  *G03F 7/20* (2006.01)

(52) U.S. Cl.
  CPC ............ *G03F 7/16* (2013.01); *G03F 7/7085* (2013.01); *G03F 7/70383* (2013.01); *G03F 7/70791* (2013.01)

(58) Field of Classification Search
  CPC ............ G03F 7/70775; G03F 7/70716; G03F 7/70191
  USPC .............................. 355/53, 72; 356/399–401
  See application file for complete search history.

(56) References Cited

U.S. PATENT DOCUMENTS

| 8,451,457 | B2 | 5/2013 | Gates et al. |
| 8,570,492 | B2 * | 10/2013 | Van Der Pasch ... G03F 7/70775 355/53 |
| 8,670,127 | B2 | 3/2014 | Deck et al. |
| 8,736,815 | B2 | 5/2014 | Beerens et al. |
| 8,760,622 | B2 | 6/2014 | Makinouchi |
| 8,760,662 | B2 | 6/2014 | Den Boef et al. |

(Continued)

FOREIGN PATENT DOCUMENTS

| JP | H06-097041 A | 4/1994 |
| JP | 2678485 B2 | 11/1997 |

(Continued)

*Primary Examiner* — Hung Henry Nguyen
(74) *Attorney, Agent, or Firm* — Muir Patent Law, PLLC

(57) ABSTRACT

An optical apparatus and a manufacturing method using the optical apparatus are disclosed. The optical apparatus includes a stage supporting a substrate, first optical systems providing a first light onto the substrate, a gantry supporting the first optical systems to transfer them on the stage, and second optical systems disposed between the gantry and the stage and detecting displacement of the first optical systems. Each of the second optical systems includes a beam source generating a second light different with the first light, and sensor arrays for sensing the second light provided to the first optical systems to detect displacement of the first optical systems.

15 Claims, 6 Drawing Sheets

(56) References Cited

U.S. PATENT DOCUMENTS

| | | | |
|---|---|---|---|
| 8,773,635 B2 * | 7/2014 | Shibazaki | G03F 7/70341 355/53 |
| 8,817,236 B2 | 8/2014 | Kanaya | |
| 2008/0036989 A1 | 2/2008 | Shibazaki | |

FOREIGN PATENT DOCUMENTS

| | | |
|---|---|---|
| JP | 5040657 B2 | 10/2012 |
| JP | 5339056 B2 | 11/2013 |
| JP | 2014-017501 A | 1/2014 |
| JP | 5403263 B2 | 1/2014 |
| KR | 20-0162278 Y1 | 12/1999 |

* cited by examiner

OPTICAL APPARATUS AND MANUFACTURING METHOD USING THE SAME

CROSS-REFERENCE TO RELATED APPLICATIONS

This U.S. non-provisional patent application claims priority under 35 U.S.C. §119 to Korean Patent Application No. 10-2014-0135067, filed on Oct. 7, 2014, the entire contents of which are hereby incorporated by reference.

BACKGROUND

This disclosure relates to an optical apparatus capable of exposing a large-area substrate.

In recent years, display apparatuses have been getting bigger in size in accordance with customer demand. Accordingly, a variety of processing equipment for manufacturing large display panels is being researched and developed. Among this equipment, an exposure apparatus is a major apparatus for deciding sizes of micro-patterns in large display panels. The exposure apparatus may transfer the micro-patterns onto a substrate of a display panel. Displacement or vibration of the exposure apparatus may frequently result in defects on the micro-patterns. Thus, the exposure apparatus may include position detectors for monitoring displacement of an optical system. The position detectors may include an electronic sensor or a differential interferometer. The electronic sensor may reduce thermal safety of the exposure optical system. The differential interferometer may measure displacement of the exposure optical system in comparison with a reference object for measuring. The differential interferometer may be generally used for a single measurement object. However, the differential interferometer may be inappropriate for measuring the variability of a plurality of exposure optical systems.

SUMMARY

Aspects of present invention provide an optical apparatus that is capable of monitoring displacement of a plurality of optical systems.

Embodiments of the inventive concept provide optical apparatuses. The optical apparatuses include a stage configured to support a substrate, a first optical system configured to provide a first light onto the substrate, a gantry configured to support the first optical system to transfer the first optical system above the stage, and a second optical system disposed between the gantry and the stage to detect displacement of the first optical system, wherein the second optical system includes a beam source configured to generate a second light that is different from the first light, and a sensor array configured to receive the second light provided to the first optical system to detect the displacement of the first optical system.

In some embodiments, the second optical system may further include a beam splitter connected to the gantry, disposed adjacent to the first optical system, and configured to split the second light into an aiming beam and a transmission beam, and a beam reflector disposed at an end portion of the first optical system to provide a reflected beam induced from the aiming beam to the sensor array, wherein the aiming beam is parallel to the first optical system and the transmission beam is parallel to the gantry.

The first optical system may include a light source configured to provide the first light, a chirping reflector configured to control the first light provided from the light source, an objective lens configured to focus the first light onto the substrate, and an optical cylinder disposed between the objective lens and the chirping reflector. The beam reflector may be disposed on an end portion of the optical cylinder adjacent to the objective lens. The first optical system may include an objective lens configured to magnify a surface of the substrate, an ocular lens disposed above the objective lens, an optical tube configured to connect the ocular lens to the objective lens, and an image sensor disposed above the ocular lens and configured to acquire a surface image of the substrate. The beam reflector may be disposed at an end portion of the optical tube adjacent to the objective lens.

The beam reflector may include a retro reflector configured to provide the reflected beam that is parallel to the aiming beam, and the sensor array detects the displacement of the first optical system by a distance between the aiming beam and the reflected beam. The gantry may include a hole through which the first optical system passes, and a spring damper configured to connect the first optical system in the hole of the gantry. The second optical system may include a beam bender disposed between the beam source and the beam splitter to change a path of the second light. A plurality of beam splitters may be aligned in a line with respect to the beam bender. The sensor array may be disposed on a bottom surface of the gantry. The sensor array may include a photo diode. The optical apparatus may include a plate disposed between the beam source and the gantry.

In one embodiment, a manufacturing method may include steps of: coating a photosensitive layer on a substrate, providing the substrate on a stage of an optical apparatus, exposing the photosensitive layer to a light pattern by the optical apparatus, and developing the photosensitive layer to form a photosensitive pattern. The optical apparatus may include a stage configured to support the substrate, a first optical system configured to provide a first light onto the substrate, a gantry configured to support the first optical system to transfer the first optical system above the stage, and a second optical system disposed between the gantry and the stage to detect displacement of the first optical system. The second optical system may include a beam source configured to generate a second light that is different from the first light, and a sensor array configured to receive the second light provided to the first optical system to detect the displacement of the first optical system.

The second optical system may be a displacement detection unit. The second optical system may include a beam splitter connected to the gantry, disposed adjacent to the first optical system, and configured to split the second light into an aiming beam and a transmission beam, and a beam reflector disposed at an end portion of the first optical system to provide a reflected beam induced from the aiming beam to the sensor array. The aiming beam may be parallel to the first optical system and the transmission beam may be parallel to the gantry.

The first optical system may include a light source configured to provide the first light, a chirping reflector configured to control the first light provided from the light source, an objective lens configured to focus the first light onto the substrate, and an optical cylinder disposed between the objective lens and the chirping reflector. The beam reflector may be disposed on an end portion of the optical cylinder adjacent to the objective lens. The beam reflector may include a retro reflector configured to provide the reflected beam that is parallel to the aiming beam, and the sensor array detects the displacement of the first optical system by a distance between the aiming beam and the reflected beam.

In one embodiment, a manufacturing method may include steps of: forming a pattern on a substrate, providing the substrate on a stage of an optical apparatus, and inspecting the pattern by the optical apparatus. The optical apparatus may include a stage configured to support the substrate, a first optical system configured to provide a first light onto the substrate, a gantry configured to support the first optical system to transfer the first optical system above the stage, and a second optical system disposed between the gantry and the stage to detect displacement of the first optical system. The second optical system may include a beam source configured to generate a second light that is different from the first light, and a sensor array configured to receive the second light provided to the first optical system to detect the displacement of the first optical system. The second optical system may include a plurality of displacement detection units.

The second optical system may include a beam splitter connected to the gantry, disposed adjacent to the first optical system, and configured to split the second light into an aiming beam and a transmission beam, and a beam reflector disposed at an end portion of the first optical system to provide a reflected beam induced from the aiming beam to the sensor array. The aiming beam may be parallel to the first optical system and the transmission beam may be parallel to the gantry. The first optical system may include an objective lens configured to magnify a surface of the substrate, an ocular lens disposed above the objective lens, an optical tube configured to connect the ocular lens to the objective lens, and an image sensor disposed above the ocular lens and configured to acquire a surface image of the substrate. The beam reflector may be disposed at an end portion of the optical tube adjacent to the objective lens. The beam reflector may include a retro reflector configured to provide the reflected beam that is parallel to the aiming beam, and the sensor array detects the displacement of the first optical system by a distance between the aiming beam and the reflected beam.

In other embodiments, the first optical systems may include a maskless exposure apparatus. The maskless exposure apparatus may include: an light source providing the first light; a chirping reflector controlling the first light provided from the light source; an objective lens focusing the first light onto the substrate; and an optical cylinder disposed between the objective lens and the chirping reflector to pass through the gantry. The beam reflectors may be disposed on ends of the optical cylinder, which are adjacent to the objective lenses.

In still other embodiments, the first optical systems may include inspection apparatuses. Each of the inspection apparatuses may include: an objective lens magnifying a surface of the substrate; an ocular lens above the objective lens; an optical tube connecting the ocular lens to the objective lens to pass through the gantry; and an image sensor disposed above the ocular lens to acquire a surface image of the substrate. The beam reflectors may be disposed on ends of the optical tube, which are adjacent to the objective lenses.

In even other embodiments, the beam reflectors may include a retro reflector providing the reflected beam that is parallel to the aiming beam. The retro reflector may include a plurality of mirror surfaces that are inclined to face each other in a V-shape. The sensor arrays may detect the displacement of the first optical systems to correspond to a distance between the aiming beam and the reflected beam.

In further embodiments, the gantry may include holes through which the first optical systems pass. The optical apparatus may further include interfaces connecting the first optical systems in the holes to the gantry. The interfaces may include spring dampers.

In still further embodiments, each of the second optical systems may further include a beam bender disposed between the beam source and the beam splitters to change a path of the second light. The beam splitters may be aligned in a line with respect to the beam bender.

In even further embodiments, the sensor arrays may be disposed on a bottom surface of the gantry.

In yet further embodiments, each of the sensor arrays may include a photo diode.

BRIEF DESCRIPTION OF THE DRAWINGS

The accompanying drawings are included to provide a further understanding of various aspects of the present invention, and are incorporated in and constitute a part of this specification. The drawings illustrate exemplary embodiments of the inventive concept and, together with the description, serve to explain various principles of different aspects of the present invention. In the drawings.

DETAILED DESCRIPTION

Figure 1:
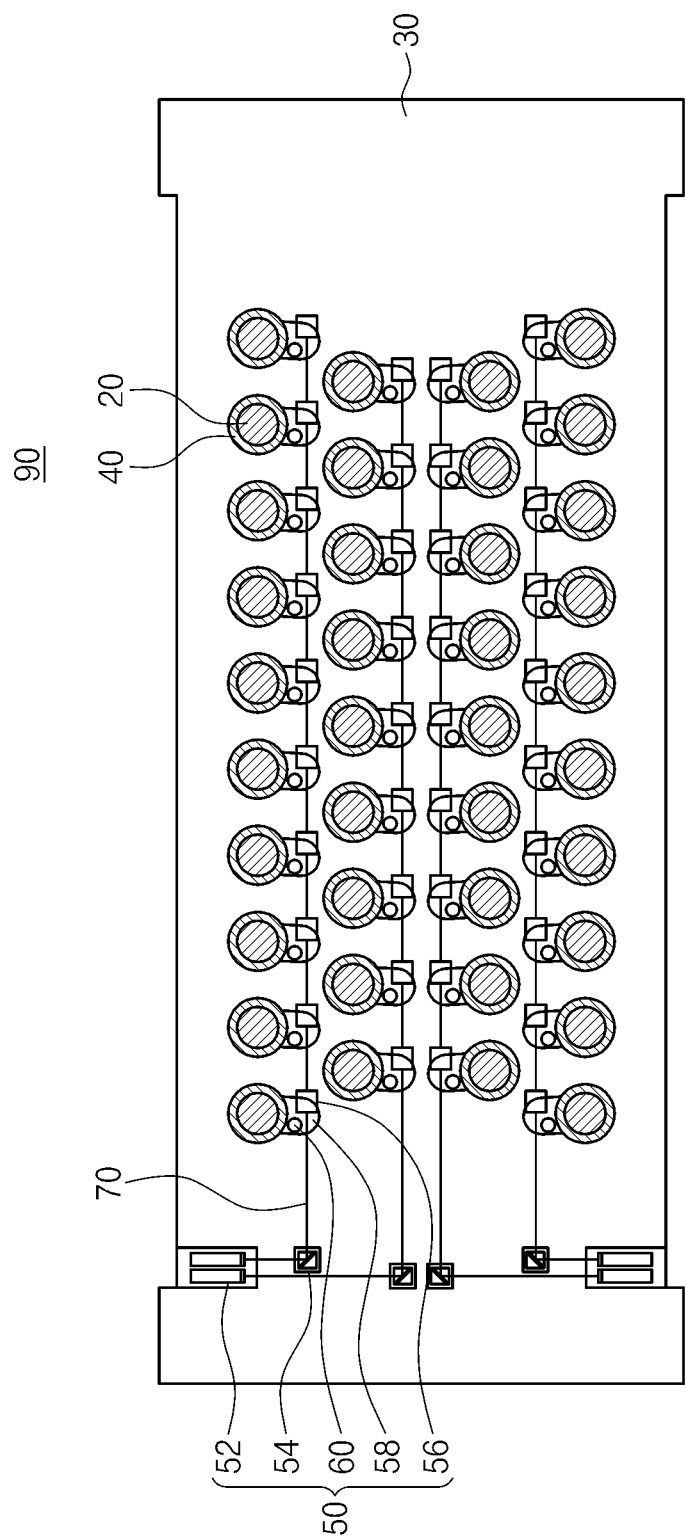
FIG. 1 is a plan view of an optical apparatus according to an embodiment of the inventive concept.

Hereinafter, exemplary embodiments will be described in detail with reference to the accompanying drawings. Advantages and features of various aspects of the present invention, and implementation methods thereof will be clarified through following embodiments described with reference to the accompanying drawings. The invention may, however, be embodied in many different forms and should not be construed as being limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity. Further, the present invention is only defined by scopes of claims. Like reference numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements should be interpreted in a like fashion (e.g., "between" versus "directly between," "adjacent" versus "directly adjacent," etc.).

Spatially relative terms, such as "beneath", "below", "lower", "under", "above", "upper", "bottom", "top", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, the technical terms are used only for explaining a specific exemplary embodiment while not limiting the present invention. The terms of a singular form "a," "an" and "the" may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. The order of the reference numerals given in the description does not limit inventive concept in that order.

Figure 2:
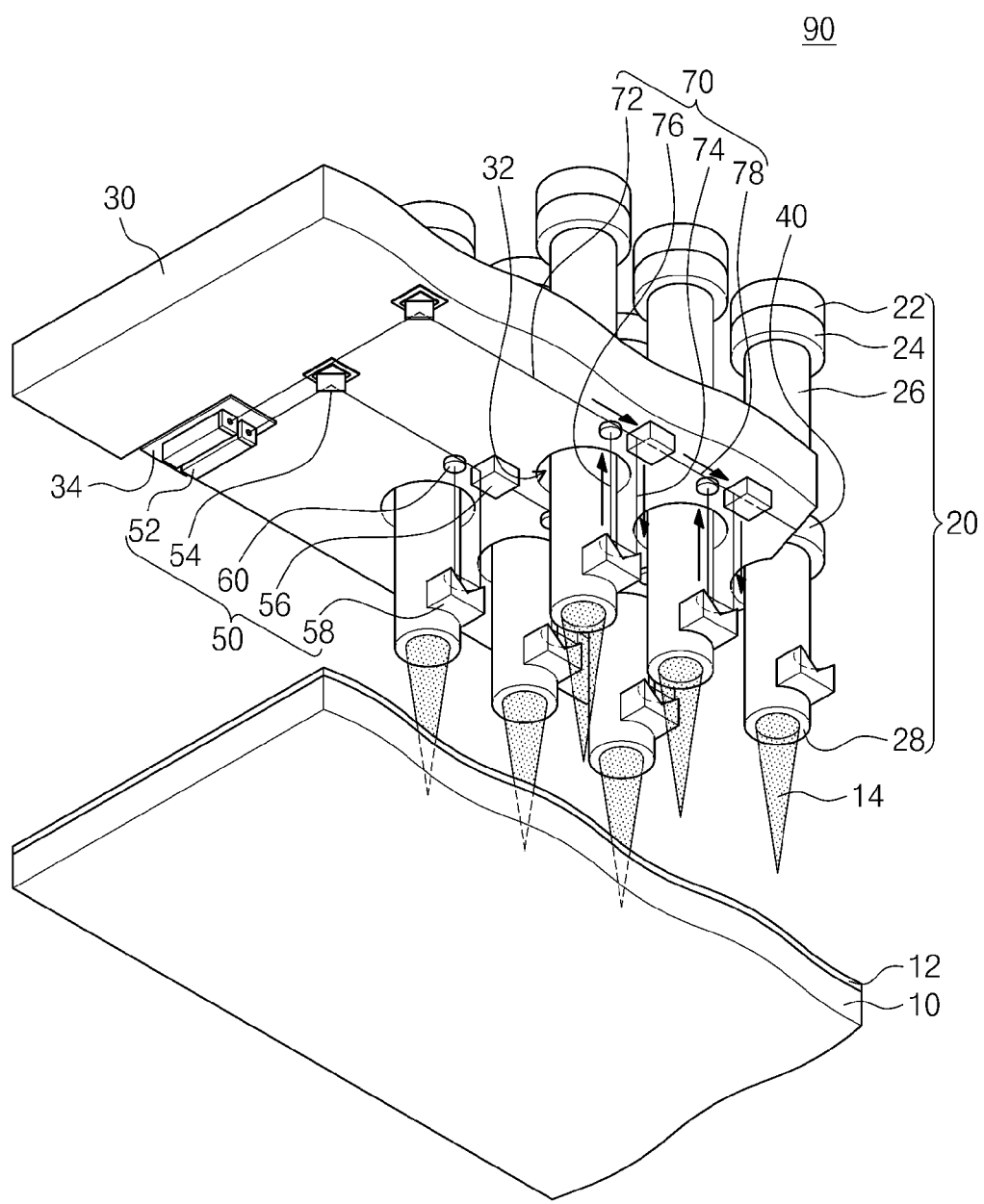
FIG. 2 is a bottom perspective view of the optical apparatus in FIG. 1, according to one exemplary embodiment.

FIGS. 1 and 2 illustrate an optical apparatus 90 according to an embodiment of the inventive concept. The optical apparatus 90 may be an exposure apparatus providing first light 14 onto a substrate 12. According to an example, the optical apparatus 90 may include a stage 10, first optical systems 20, a gantry 30, interfaces 40, and second optical systems 50.

The stage 10 may support the substrate 12. The substrate 12 may include, for example, a glass substrate or a silicon wafer.

The first optical systems 20, also referred to as optical units 20, or optical irradiating units 20, may be disposed above the stage 10 and the substrate 12. The gantry 30 may support the first optical systems 20. According to an example, the first optical systems 20 may include maskless exposure optics irradiating the first light 14 onto the substrate 12 to transfer a pattern without using a mask. For example, each of the first optical systems 20 may include a light source 22, a chirping reflector 24, an optical cylinder 26, and an objective lens 28.

The light source 22 may generate the first light 14. The first light 14 may include, for example, ultraviolet exposure light. According to wavelengths of the first light 14, the light source 22 may include G-line (436 nm), I-line (365 nm), KrF (248 nm), ArF (193 nm), or F (157 nm). The first light 14 may be controlled by the chirping reflector 24 to transfer the pattern onto the substrate 12 without using a mask.

The chirping reflector 24 may induce chirping of the first light 14 according to an external control signal. In FIG. 2, the light source 22 and the chirping reflector 24 are connected and arranged serially and are stacked in perpendicular direction with respect to the stage 10. The light source 22 and the chirping reflector 24 may alternatively be connected and arranged inclinedly or in parallel with respect to the stage 10. In this case a reflector may be included in each optical unit 20 to adjust the route of the light.

The optical cylinder 26 may be disposed between the light source 22 and the objective lens 28. The first light 14 may progress to the objective lens 28 through the optical cylinder 26. A plurality of lenses (not shown) may be disposed in the optical cylinder 26.

The objective lens 28 may be disposed at an end of the optical cylinder 26 that is adjacent to the substrate 12. The objective lens 28 may focus the first light 14 onto the substrate 12.

The gantry 30 may be disposed parallel to the stage 10. The gantry 30 may cross each of the first optical systems 20. According to an example, the gantry 30 may have a plurality of holes 32. The first optical systems 20 may be arranged along the holes 32 to pass through the holes. The first optical systems 20 may be disposed perpendicular to the gantry 30 and the stage 10. The gantry 30 may move or transfer the first optical systems 20 in a direction parallel to the stage 10. The first light 14 may be irradiated onto the substrate 12. The first optical systems 20 may uniformly irradiate the first light 14 onto a predetermined area of the substrate 12 to form the same pattern. The first optical systems 20 may irradiate the first light 14 onto a large-area substrate 12 for a short time.

The interfaces 40 may connect the first optical systems 20 to the gantry 30. The interfaces 40 may be disposed on portions of a top surface of the gantry 30, which are adjacent to holes 32, respectively. In certain examples, the interfaces 40 may include spring dampers.

The second optical systems 50, also referred to herein as optical detection units 50 or displacement detection units 50, may detect an aiming direction of the first light 14. According to an example, the second optical systems 50 may be disposed on the gantry 30 and the optical cylinders 26. The second optical systems 50 may detect displacement of the optical cylinders 26 with respect to the gantry 30. For example, when the gantry 30 is stopped, the optical cylinders 26 may be disposed perpendicular to the substrate 12. On the contrary, when the gantry 30 moves, the optical cylinders 26 may vibrate. The optical cylinders 26 may vibrate with the same frequency. Alternatively, the optical cylinders 26 may vibrate with frequencies different from each other. Each second optical system 50 may detect displacement of a respective one, or a particular group of the optical cylinders 26. According to an example, each of the second optical systems 50 may include a beam source 52, a beam bender 54, beam splitters 56, beam reflectors 58, and position sensing modules (PSM) 60.

The beam sources 52 may generate second light 70. The beam sources 52 may include a laser. The second light 70 may include a laser beam. The beam sources 52 may be disposed on a side of an edge of a bottom surface of the gantry 30. A plate 34 may be disposed between the beam sources 52 and the gantry 30. The plate 34 may block heat transfer from the beam sources 52 to the gantry 30. Also, the plate 34 may help coupling and/or alignment of the beam sources 52 and gantry 30.

The beam benders 54 may be disposed on the bottom surface of the gantry 30. The beam benders 54 may change the progress direction of the second light 70. The beam benders 54 may increase a light path distance between the beam sources 52 and the beam splitters 56. The beam sources 52 may be spaced a predetermined distance or more from the first optical systems 20. The first optical systems 20 may be protected from heat generated from the beam sources 52. In one embodiment, each beam source 52 along with a corresponding beam bender 54 is used for a plurality of optical units 20, for example, a group of optical units in a particular row. In another embodiment (not shown), one beam source 52 may be used for a group of optical units 20 in two rows or more. For example, one or more beam splitters may be equipped between the beam source 52 and the beam bender 54 to split and send the beam to respective rows. In one embodiment, one or more beam sources 52 may send the second light 70 to the whole group of second optical systems 50 of a gantry 30. In one embodiment, the plate 34 may be made of a heat insulating material. A heat insulating layer may be disposed between the plate 34 and the gantry 30.

The beam splitters 56 may be disposed on portions of the bottom surface of the gantry 30, which are adjacent to the holes 32. The beam splitters 56 may be aligned in a line towards the beam benders 54 so that the beam splitters 56 can properly receive beams coming from beam benders 54. The beam splitters 56 may split an incident beam 72 of the second light 70 into a transmission beam 78 and an aiming beam 74.

The transmission beam 78 may progress to be provided to the following beam splitters 56. The beam splitters 56 may split the aiming beam 74 from the transmission beam 78. The aiming beam 74 may progress in a direction parallel to the optical cylinders 26. The aiming beam 74 may be provided to the beam reflectors 58.

The beam reflectors 58 may be disposed at end portions of the first optical systems 20 which are between the substrate 12 and the gantry 30. The beam reflectors 58 may be disposed adjacent to the objective lenses 28. The beam reflectors 58 may include a retro reflector. The beam reflectors 58 may reflect the second light 70 in a parallel manner between the beam splitter 56 and the PSMs 60. The parallel manner of the beam reflection of the second light 70 may also be described to be reflected in an antiparallel manner in that the second light beams 74 and 76 progress in the opposite direction with respect to each other.

In one embodiment, each optical unit 20 is associated with its own corresponding beam splitter 56, beam reflector 58, and PSM 60. As described herein, an optical detection unit may refer to a second optical system 50 including a beam source 52, a beam bender 54, and a set of beam splitters 56, beam reflectors 58, and PSMs 60 corresponding to a row of optical units 20. Also, an optical detection unit may refer to a beam source 52, a beam bender 54, and a beam splitter 56, a beam reflector 58, and a PSM 60 that correspond with a first optical unit 20.

Figure 3:
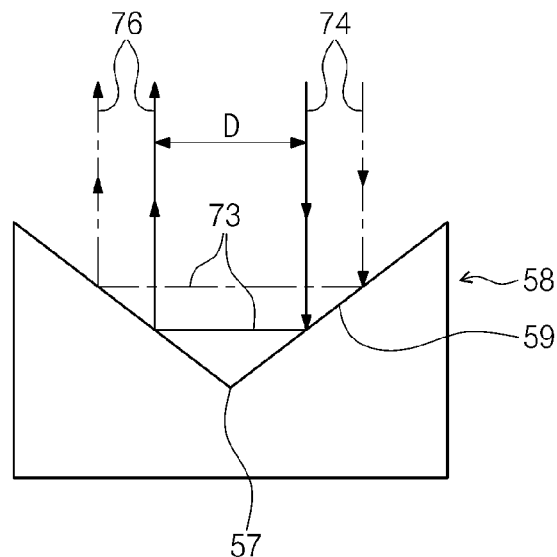
FIG. 3 is a view of a retro reflector, according to one exemplary embodiment.

FIG. 3 schematically illustrates a retro reflector according to one embodiment. A beam reflector 58 may provide a reflected beam 76 which is parallel (this may be also expressed to be antiparallel as described above) to the aiming beam 74. The beam reflectors 58 may include a plurality of mirror surfaces 59. The mirror surfaces 59 may be inclined to face each other in a V-shape, and thus may be positioned in a concave manner. The aiming beam 74 may be reflected from a mirror surface 59 that is disposed on one side of the beam reflector 58 to be an inner reflected beam 73. The inner reflected beam 73 may be reflected from a mirror surface 59 that is disposed on another side of the beam reflector 58 to be a reflected beam 76. The aiming beam 74 and the reflected beam 76 may be parallel (or antiparallel) to each other. With respect to beam path, the mirror surfaces 59 may be disposed on opposite first and second sides with respect to a center 57 of the beam reflector 58. In one embodiment, the mirror surfaces 59 may be disposed symmetrically with respect to the center 57 of the beam reflector 58. One mirror surface may be on an incident side of the center 57 and the other mirror surface may be on a reflection side of the center 57.

When the aiming beam 74 is changed in position with respect to the mirror surfaces 59, the reflected beam may also move. Accordingly, the distance D between the aiming beam 74 and the reflected beam 76 may be changed. For example, when the aiming beam 74 is away from the center 57 of the beam reflector 58, the reflected beam 76 may also be away from the center 57 of the beam reflector 58. In this case, the distance D between the aiming beam 74 and the reflected beam 76 may be increased. On the contrary, when the aiming beam 74 is close to the center 57 of the beam reflector 58, the reflected beam 76 may also be close to the center 57 of the beam reflector 58. In this case, the distance D between the aiming beam 74 and the reflected beam 76 may be reduced.

Referring again to FIG. 2, when one of the first optical systems 20 is changed in displacement, the distance between the corresponding aiming beam 74 and the corresponding reflected beam 76 may be changed. However, the distance between the aiming beam 74 and the reflected beam 76 may not be equal to 0. This may occur because centers of the beam splitter 56 and PSMs 60 may be set not to coincide. An alignment position of each of the first optical systems 20 may be set to correspond to a predetermined distance between the aiming beam 74 and the reflected beam 76. The distance between the aiming beam 74 and the reflected beam 76 may be measured by the PSMs 60.

In one embodiment, the PSMs 60 may be disposed adjacent to the beam splitters 56 on the bottom surface of the gantry 30. The PSMs 60 may sense the reflected beam 76 to detect displacement of the first optical systems 20.

Figure 4:
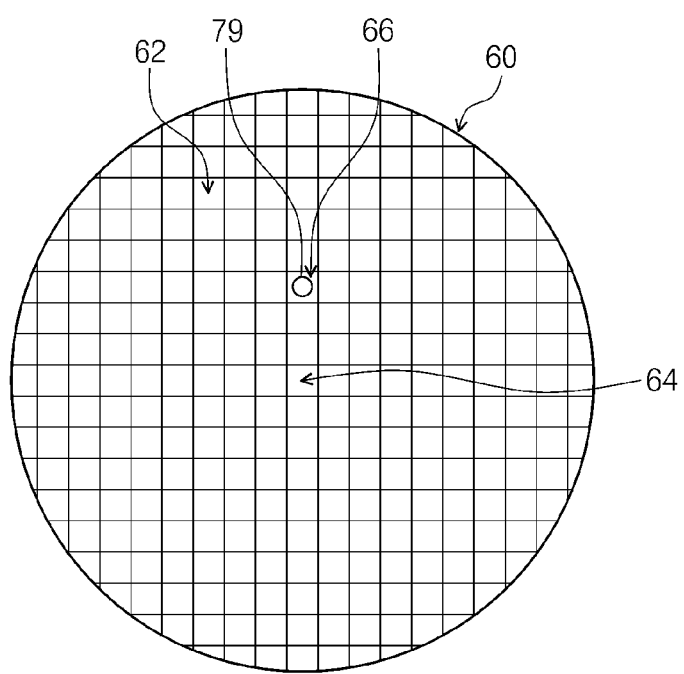
FIG. 4 is a plan view of a position sensing module in FIG. 2, according to one exemplary embodiment.

FIG. 4 illustrates a PSM 60 according to one exemplary embodiment. Each of the PSMs 60 may include sensor array cells 62. For example, each of the sensor array cells 62 may include a photo diode. The sensor array cell 62 may have a size equal to or greater than a spot size of the second light 70. For example, when a reflected beam 76 is supplied to a beam detection cell 66, the PSM may detect displacement of a corresponding first optical unit 20 according to the direction and the distance between a central cell 64 and the beam detection cell 66 of the PSM 60. Alternatively, a PSM 60 may include a charge coupled device (CCD) sensor or a CMOS sensor.

Figure 5:
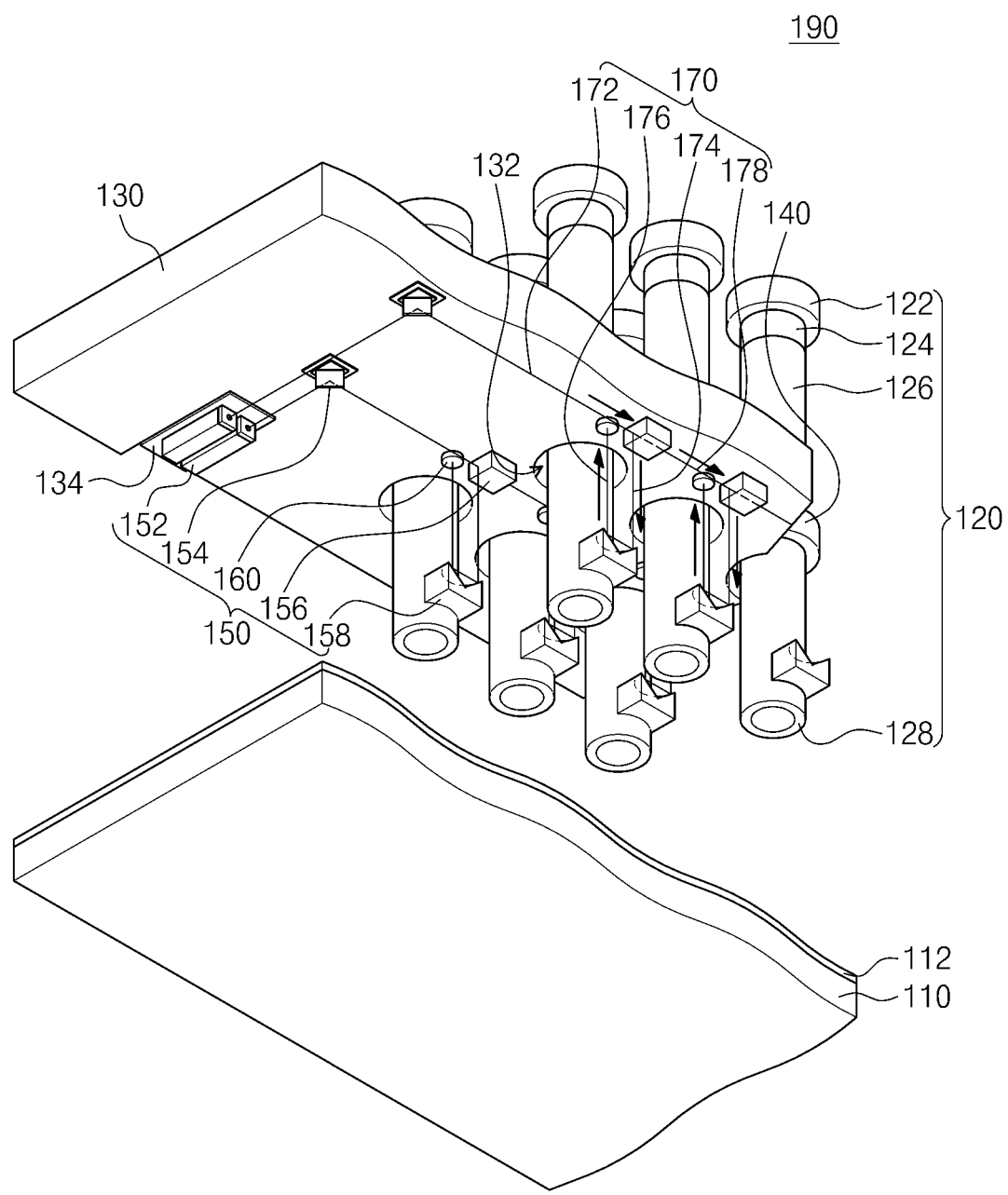
FIG. 5 is a bottom perspective view of an optical apparatus according to another embodiment of the inventive concept.

FIG. 5 illustrates an optical apparatus 190 according to another embodiment of the inventive concept. The optical apparatus 190 may be an inspection apparatus. According to an example, the optical apparatus 190 may include a stage 110, first optical systems 120 (e.g. optical units or optical inspection units), a gantry 130, interfaces 140, and second optical systems 150 (e.g. optical detection units or optical displacement units).

The first optical systems 120 may magnify surfaces of a substrate 112 on the stage 110 to inspect the magnified surface of the substrate 112. For example, each of the first optical systems 120 may include an image sensor 122, an ocular lens 124, an optical tube 126, and an objective lense 128.

The image sensors 122 may acquire surface images of the substrate 112. For instance, an image sensor 122 may include a CCD sensor, a CMOS sensor and/or a camera.

The ocular lenses 124 may be disposed adjacent to the image sensors 122. The ocular lenses 124 may provide surface images projected by the objective lenses 128 to the image sensors 122. Magnification of the surface images may be adjusted according to the distances between the ocular lenses 124 and the objective lenses 128.

The optical tubes 126 may be disposed between the ocular lenses 124 and the objective lenses 128. The objective lenses 128 may be disposed at end portions of the optical tubes 126 opposite to the ocular lenses 124. The optical tubes 126 may pass through holes 132 of the gantry 130. The interfaces 140 may connect the optical tubes 126 to the gantry 130.

The second optical systems 150 may detect the directions of the optical tubes 126 of the first optical system by using the second light 170. The beam splitters 156 and PSMs 160 of the second optical system 150 may be disposed adjacent to the optical tubes 126 on the bottom surface of the gantry 130. Similarly, beam sources 152 and beam benders 154 may be disposed on the bottom surface of the gantry 130. Plates 134 may be disposed between the beam sources 152 and the gantry 130. An incident beam 172 of the second light 170 may be provided from the beam sources 152 to the beam splitters 156. The incident beam 172 may be split into a transmission beam 178 and an aiming beam 174 by the beam splitters 156. The beam splitters 156 may provide the aiming beams 174 to reflectors 158. The reflectors 158 may be disposed at end portions of the optical tubes 126 adjacent to the objective lenses 128. The reflectors 158 may provide the reflected beams 176 generated from the aiming beams 174 to the PSMs.

In one embodiment, the light sources 22, the chirping reflectors 24, and the optical cylinders 26 of the first optical system 120 may be replaced by the image sensors 122, the ocular lenses 124, and the optical tubes 126, respectively. Thus, the gantry 130 and second optical systems 150 can be used both for pattern formation and substrate inspection by interchanging first optical systems 20 and 120.

Figure 6:
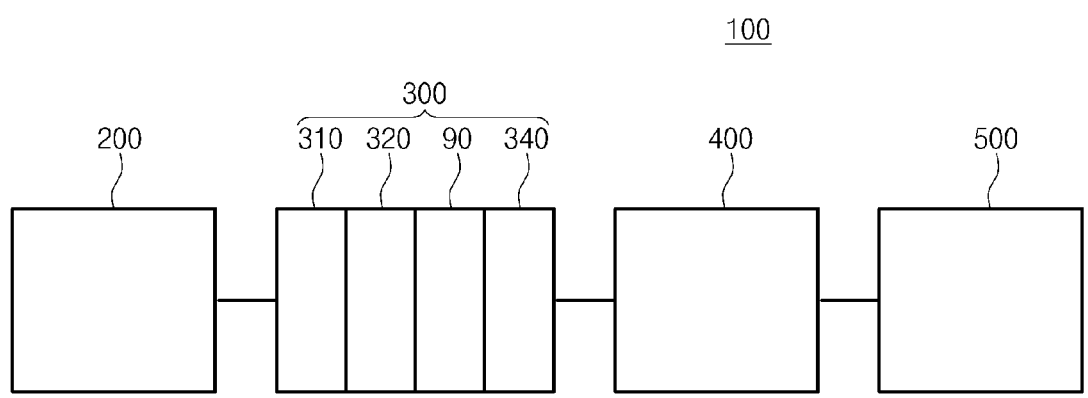
FIG. 6 is a view of manufacturing equipment including the optical apparatus according to an embodiment of the inventive concept.

FIG. 6 illustrates manufacturing equipment 100 including an optical apparatus 90 according to an embodiment of the inventive concept. The manufacturing equipment 100 may be a manufacturing equipment for a display device or a semiconductor device. According to an example, the manufacturing equipment 100 may include deposition equipment 200, photo spinner equipment 300, etching equipment 400, and/or cleaning equipment 500.

The deposition equipment 200 may form a thin film on the substrate 12. The thin film may include, for example, an insulation layer, a metal layer, and/or a semiconductor layer. For example, the deposition equipment 200 may include a chemical vapor deposition apparatus and/or a sputtering apparatus.

The photo spinner equipment 300 may form a photoresist pattern on the substrate 12. The photoresist pattern may include a mask pattern for patterning the substrate 12 or the thin film in a predetermined shape. For example, the photo spinner equipment 300 may include a spinner 310, a baker 320, an optical apparatus 90, and a developing apparatus 340. The optical apparatus 90 may be one of the embodiments described in this disclosure.

The etching equipment 400 may be an apparatus for removing a portion of the substrate 12 or a thin film according to the photoresist pattern. The etching equipment 400 may include, for example, a dry etching equipment and/or a wet etching equipment. The dry etching equipment may be equipment for removing a portion of the substrate 12 or a thin film by using an etching gas. The wet etching equipment may be equipment for etching the substrate 12 or a thin film by using an etching solution.

The cleaning equipment 500 may be an apparatus for removing the photoresist pattern and cleaning the substrate 12. The photoresist pattern may be removed, for example, by a cleaning gas or an organic solvent. The cleaning equipment 500 may include an ashing equipment. The substrate 12 may be cleaned by deionized water in a cleaning bath. Although not shown, the manufacturing equipment 100 may further include ion implantation equipment and/or chemical mechanical polishing equipment.

As described above, an optical apparatus according to an embodiment of the inventive concept may include second optical systems monitoring the displacement of a plurality of first optical systems which are connected to a gantry. The second optical systems may include beam sources, beam splitters, and position sensing modules, which are fixed to the gantry, and may further include beam reflectors fixed to first optical systems. The position sensing modules may detect the displacement of the first optical systems, which may be caused by a movement of the gantry.

Figure 7:
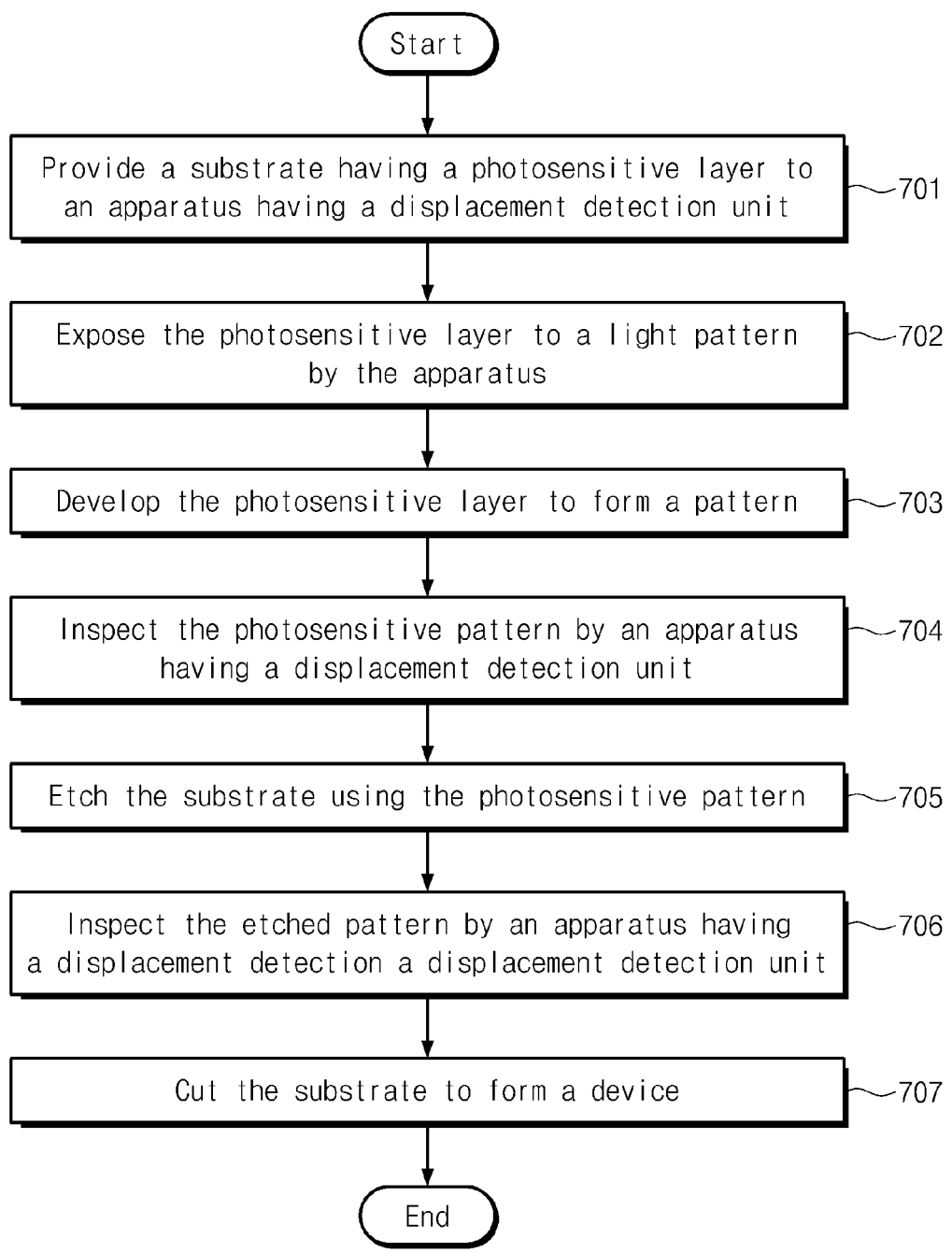
FIG. 7 is a flowchart illustrating a manufacturing method of a device using an apparatus according to one exemplary embodiment.

In one embodiment, as depicted for example in FIG. 7, the optical apparatus of one of the examples described above may be applied to a manufacturing process for a semiconductor device or a display device. In a semiconductor manufacturing process, a substrate may be provided on the stage 10 or 110. (step 701) For example, the substrate may be a semiconductor substrate such as a silicon wafer. The substrate may have a photosensitive layer on top of the substrate and may be exposed to a light pattern by the optical apparatus (step 702). The substrate may be a bare silicon wafer coated with a photosensitive layer when it is provided on the stage 10 or 110. The substrate may further include a layer of metal, insulator, or semiconductor formed between the substrate and photosensitive layer. The substrate may have a pattern of metal, insulator, or semiconductor material between the substrate and the photosensitive layer. The photosensitive layer may be developed to form a photosensitive layer pattern after it is exposed to the light pattern (step 703). The photosensitive layer pattern may be used as a mask pattern to etch out the material under the photosensitive layer (step 705). While steps 701 through 707 are all included in one embodiment, another embodiment may not include steps 704 and 706.

In another embodiment, the substrate for manufacturing a semiconductor device may have a metal pattern, a semiconductor pattern, or an insulator pattern on top of the substrate and may be inspected by the optical apparatus to determine whether there is a defect in the pattern. For example, in one embodiment, after an etching is performed using a set of optical irradiating units attached to a gantry, the optical irradiating units may be replaced by optical inspection units, and an inspection may be performed. (steps 704 and 706) One of step 704 or 706 may be performed without the other.

In one embodiment, the substrate exposed to the light pattern of the optical apparatus and/or inspected by the optical apparatus may be cut to form a semiconductor device (step 707). The semiconductor device may refer to one of various devices, for example, a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. The semiconductor device may be more generally referred to as an electronic device, which may include a device, such as a memory module, memory card, hard drive including additional components, or a mobile phone, laptop, tablet, desktop, camera, or other consumer electronic device, etc.

In a display device manufacturing process according to one embodiment, a glass substrate or a plastic substrate may be provided on the stage 10 or 110 of the optical apparatus. The substrate may have a photosensitive layer on top of the substrate and may be exposed to a light pattern by the optical apparatus. The substrate may have a metal layer, a semiconductor layer, or an insulator layer between the substrate and the photosensitive layer. The photosensitive layer may be developed to form a photosensitive layer pattern after the photosensitive layer is exposed to the light pattern of the optical apparatus. The photosensitive layer pattern may be used as a mask to etch out the metal layer, the semiconductor layer, or the insulator layer formed between the substrate and the photosensitive layer.

In another embodiment for manufacturing a display device, the substrate may have a metal pattern, a semiconductor pattern, or an insulation pattern on top of the glass substrate and may be inspected by the optical apparatus to determine whether there is a pattern defect in the pattern. As used herein and other embodiments in this disclosure, a display device may refer to an OLED (organic light emitting diode) display, an LCD (liquid crystal display), or a flexible display.

The present disclosure is intended to be illustrative, and those with ordinary skill in the technical field of the present disclosure will be understood that the present inventive concept can be carried out in other specific forms without changing the technical idea or essential features. Therefore, it should be understood that the embodiments described above are exemplary and not restrictive.

What is claimed is:

1. An optical apparatus, comprising:
a stage configured to support a substrate;
a first optical system configured to provide a first light onto the substrate;
a gantry configured to support the first optical system to transfer the first optical system above the stage; and
a second optical system disposed between the gantry and the stage to detect displacement of the first optical system,
wherein the second optical system comprises:
a beam source configured to generate a second light that is different from the first light;
a sensor array configured to receive the second light provided to the first optical system to detect the displacement of the first optical system;
a beam splitter connected to the gantry, disposed adjacent to the first optical system, and configured to split the second light into an aiming beam and a transmission beam; and
a beam reflector disposed at an end portion of the first optical system to provide a reflected beam induced from the aiming beam to the sensor array,
wherein the aiming beam is parallel to the first optical system and the transmission beam is parallel to the gantry.

2. The optical apparatus of claim 1, wherein the first optical system comprises:
a light source configured to provide the first light;
a chirping reflector configured to control the first light provided from the light source;
an objective lens configured to focus the first light onto the substrate; and
an optical cylinder disposed between the objective lens and the chirping reflector,
wherein the beam reflector is disposed on an end portion of the optical cylinder adjacent to the objective lens.

3. The optical apparatus of claim 1, wherein the first optical system comprises:
an objective lens configured to magnify a surface of the substrate;
an ocular lens disposed above the objective lens;
an optical tube configured to connect the ocular lens to the objective lens; and
an image sensor disposed above the ocular lens and configured to acquire a surface image of the substrate,
wherein the beam reflector is disposed at an end portion of the optical tube adjacent to the objective lens.

4. The optical apparatus of claim 1, wherein the beam reflector comprises a retro reflector configured to provide the reflected beam that is parallel to the aiming beam, and
the sensor array detects the displacement of the first optical system by a distance between the aiming beam and the reflected beam.

5. The optical apparatus of claim 1, wherein the gantry comprises a hole through which the first optical system passes, and
a spring damper configured to connect the first optical system in the hole of the gantry.

6. The optical apparatus of claim 1, wherein the second optical system further comprises a beam bender disposed between the beam source and the beam splitter to change a path of the second light,
wherein the beam splitter is one of a plurality of beam splitters aligned in a line with respect to the beam bender.

7. The optical apparatus of claim 1, wherein the sensor array is disposed on a bottom surface of the gantry.

8. The optical apparatus of claim 1, wherein the sensor array comprises a photo diode.

9. The optical apparatus of claim 1, further comprising a plate disposed between the beam source and the gantry.

10. A manufacturing method, comprising:
coating a photosensitive layer on a substrate;
providing the substrate on a stage of an optical apparatus;
exposing the photosensitive layer to a light pattern by the optical apparatus; and
developing the photosensitive layer to form a photosensitive pattern,
wherein the optical apparatus comprises, a stage configured to support the substrate,
a first optical system configured to provide a first light onto the substrate,
a gantry configured to support the first optical system to transfer the first optical system above the stage, and
a second optical system disposed between the gantry and the stage to detect displacement of the first optical system,
wherein the second optical system comprises:
a beam source configured to generate a second light that is different from the first light;
a sensor array configured to receive the second light provided to the first optical system to detect the displacement of the first optical system;
a beam splitter connected to the gantry, disposed adjacent to the first optical system, and configured to split the second light into an aiming beam and a transmission beam; and
a beam reflector disposed at an end portion of the first optical system to provide a reflected beam induced from the aiming beam to the sensor array,
wherein the aiming beam is parallel to the first optical system and the transmission beam is parallel to the gantry,
wherein the second optical system is a displacement detection unit.

11. The method of claim 10, wherein the first optical system comprises:
a light source configured to provide the first light;
a chirping reflector configured to control the first light provided from the light source;
an objective lens configured to focus the first light onto the substrate; and
an optical cylinder disposed between the objective lens and the chirping reflector,
wherein the beam reflector is disposed on an end portion of the optical cylinder adjacent to the objective lens.

12. The method of claim 10, wherein the beam reflector comprises a retro reflector configured to provide the reflected beam that is parallel to the aiming beam, and
the sensor array detects the displacement of the first optical system by a distance between the aiming beam and the reflected beam.

13. A manufacturing method, comprising:
forming a pattern on a substrate;
providing the substrate on a stage of an optical apparatus; and
inspecting the pattern by the optical apparatus,
wherein the optical apparatus comprises,
a stage configured to support the substrate,
a first optical system configured to provide a first light onto the substrate,
a gantry configured to support the first optical system to transfer the first optical system above the stage, and
a second optical system disposed between the gantry and the stage to detect displacement of the first optical system,
wherein the second optical system comprises:
a beam source configured to generate a second light that is different from the first light;
a sensor array configured to receive the second light provided to the first optical system to detect the displacement of the first optical system;
a beam splitter connected to the gantry, disposed adjacent to the first optical system, and configured to split the second light into an aiming beam and a transmission beam; and
a beam reflector disposed at an end portion of the first optical system to provide a reflected beam induced from the aiming beam to the sensor array,
wherein the aiming beam is parallel to the first optical system and the transmission beam is parallel to the gantry,
wherein the second optical system includes a plurality of displacement detection units.

14. The method of claim 13, wherein the first optical system comprises:
an objective lens configured to magnify a surface of the substrate;
an ocular lens disposed above the objective lens;
an optical tube configured to connect the ocular lens to the objective lens; and
an image sensor disposed above the ocular lens and configured to acquire a surface image of the substrate,
wherein the beam reflector is disposed at an end portion of the optical tube adjacent to the objective lens.

15. The method of claim 14, wherein the beam reflector comprises a retro reflector configured to provide the reflected beam that is parallel to the aiming beam, and
the sensor array detects the displacement of the first optical system by a distance between the aiming beam and the reflected beam.

* * * * *